US006177236B1

(12) United States Patent
Apte

(10) Patent No.: US 6,177,236 B1
(45) Date of Patent: Jan. 23, 2001

(54) METHOD OF MAKING A PIXELIZED SCINTILLATION LAYER AND STRUCTURES INCORPORATING SAME

(75) Inventor: Raj B. Apte, Palo Alto, CA (US)

(73) Assignee: Xerox Corporation, Stamford, CT (US)

( * ) Notice: Under 35 U.S.C. 154(b), the term of this patent shall be extended for 0 days.

(21) Appl. No.: 08/985,690

(22) Filed: Dec. 5, 1997

(51) Int. Cl.$^{7}$ ..................... G03F 7/00

(52) U.S. Cl. ..................... 430/320; 430/323; 430/324

(58) Field of Search ..................... 430/320, 314, 430/323, 324, 139, 6, 967; 216/94, 83; 250/473.1, 483.1, 472.1, 361; 427/65

(56) References Cited

U.S. PATENT DOCUMENTS

| | | | | |
|---|---|---|---|---|
| 3,041,456 | | 6/1962 | MacLeod | 250/80 |
| 3,825,787 | | 7/1974 | Doolittle | 313/102 |
| 3,936,645 | | 2/1976 | Iverson | 250/486 |
| 4,011,454 | | 3/1977 | Lubowski et al. | 250/483 |
| 4,069,355 | | 1/1978 | Lubowski et al. | 427/70 |
| 4,208,577 | | 6/1980 | Wang | 250/213 |
| 4,415,605 | * | 11/1983 | Davis et al. | 427/65 |
| 4,572,880 | * | 2/1986 | Miura | 430/5 |
| 4,637,898 | | 1/1987 | DeBoer et al. | 721/130 |
| 4,769,549 | * | 9/1988 | Tsuchino et al. | 250/484.1 |
| 4,992,699 | * | 2/1991 | McClure et al. | 313/525 |
| 5,037,577 | | 8/1991 | Yamanoi et al. | 252/301 |
| 5,153,438 | | 10/1992 | Kingsley et al. | 250/370 |
| 5,171,996 | * | 12/1992 | Perez-Mendez | 250/361 |
| 5,234,571 | | 8/1993 | Nelson | 264/21 |
| 5,302,423 | | 4/1994 | Tran et al. | 427/555 |
| 5,334,842 | | 8/1994 | Van havenbergh et al. | 250/483.1 |
| 5,368,882 | | 11/1994 | Tran et al. | 427/65 |
| 5,378,962 | | 1/1995 | Gray et al. | 313/495 |
| 5,391,879 | | 2/1995 | Tran et al. | 250/367 |
| 5,411,806 | | 5/1995 | Dahlquist | 428/411 |
| 5,418,377 | | 5/1996 | Tran et al. | 250/438.1 |
| 5,519,227 | | 5/1996 | Karellas | 250/483.1 |
| 5,520,965 | * | 5/1996 | Dahlquist et al. | 427/515 |
| 5,569,485 | * | 10/1996 | Dahlquist et al. | 427/65 |
| 5,712,483 | | 1/1998 | Boone et al. | 250/367 |
| 5,773,829 | | 6/1998 | Iwanczyk et al. | 250/367 |
| 5,846,873 | * | 12/1998 | Violette et al. | 438/585 |

FOREIGN PATENT DOCUMENTS

| | | | |
|---|---|---|---|
| 55-072339 | * | 5/1980 | (JP) . |
| 55-081439 | * | 6/1980 | (JP) . |

OTHER PUBLICATIONS

Wowk, B., Shalev, S., and Radcliffe, T., "Grooved phosphor screens for on–line portal imaging," Medical Physics, vol. 20, No. 6, Nov./Dec. 1993, pp. 1641–1651.

Jing, T. et al. "Enhanced Columnar Structure in CsI Layer by Substrate Patterning," Presented at *Nuc. Sci. Sym.*, Santa Fe, New Mexico (1991), LBL31383.

Takahashi, T., et al., "Design of Integrated Radiation Detectors with a–Si Photodiodes on Ceramic Scintillators for use in X–Ray Computed Tomography," IEEe Transactions on Nuclear Science, vol. 37, No. 3, Jun. 1990.

* cited by examiner

*Primary Examiner*—Kathleen Duda

(57) ABSTRACT

A pixelized scintillation layer is taught in which high aspect ratio columns of scintillation material are formed. The columns may be sized and spaced to correspond to the sizing and spacing of an underlying sensor array, or they may be sized such that there is plurality of columns for each pixel. A method for forming the pixelized scintillation layer includes the step of forming openings such as wells, vias, or channels in a body, for example by etching a thick photoresist, ion beam etching, anodic etching, etc., and the step of filling the openings with scintillation material. A completed image sensing apparatus is also taught.

36 Claims, 16 Drawing Sheets

FIG. 2
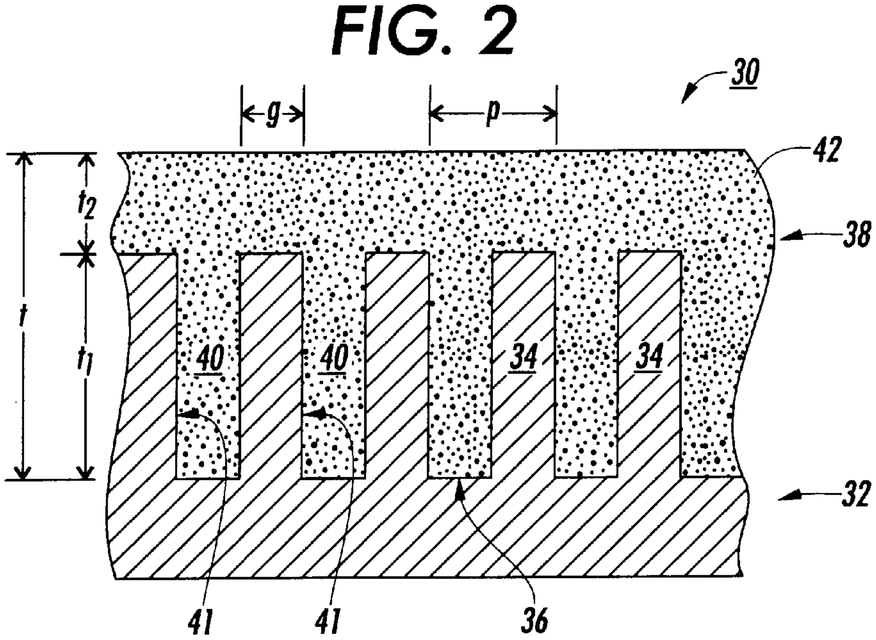
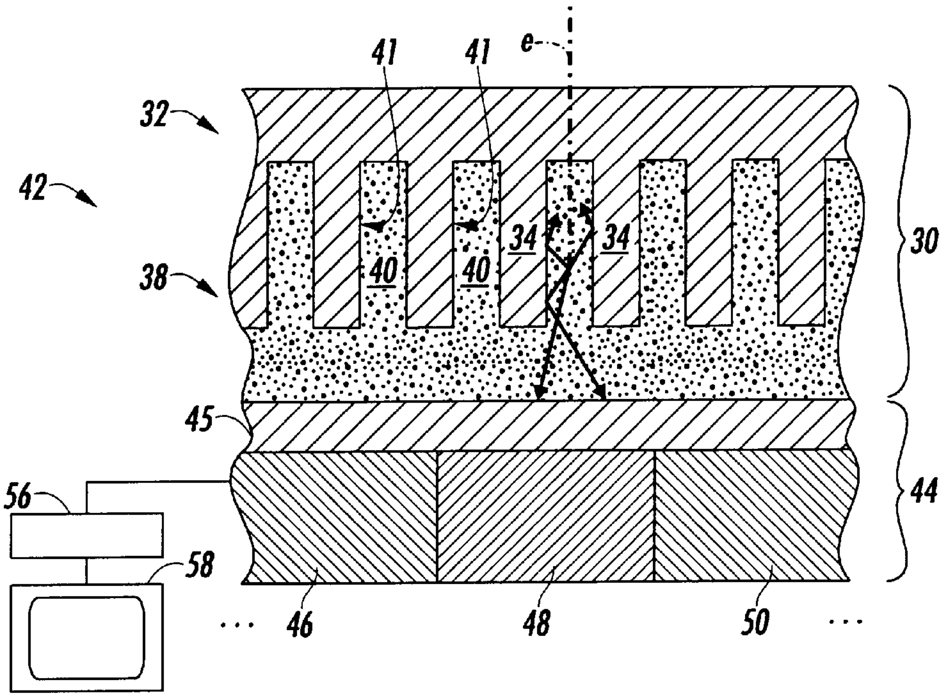
FIG. 3

FIG. 6
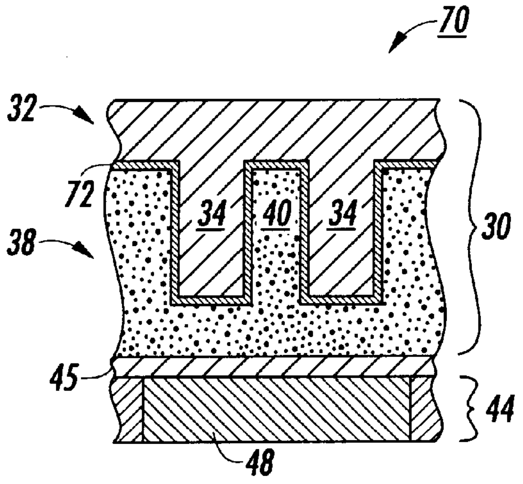
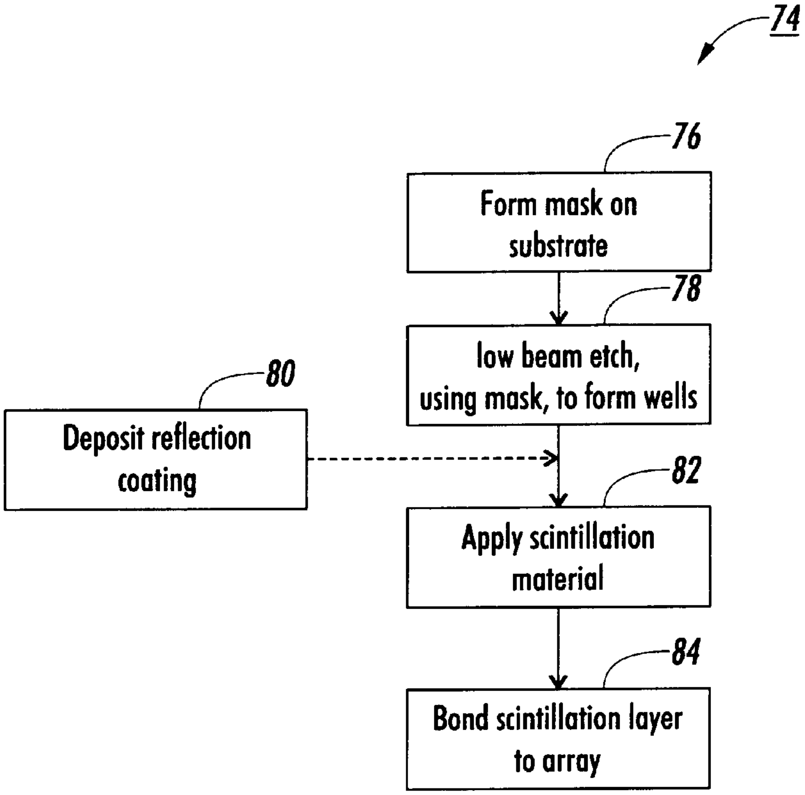
FIG. 7

METHOD OF MAKING A PIXELIZED SCINTILLATION LAYER AND STRUCTURES INCORPORATING SAME

STATEMENT AS TO RIGHTS TO INVENTIONS MADE UNDER FEDERALLY SPONSORED RESEARCH AND DEVELOPMENT

A portion of this work was done under a Federally Sponsored ARPA program, agreement no. MDA972-94-3-0027.

BACKGROUND

The present invention relates to image capture devices, such as x-ray sensors, and more particularly to a digital (pixelized) scintillation layer.

Image capture devices of the type to which the present invention pertains are typically designed to capture relatively large images employing a radiation source outside the visible light spectrum, for example those employing an x-ray source. Due to the large image area size, for example greater than several square inches, image capture device in this class will generally include an amorphous silicon (a-Si:H) sensor array. This array includes a plurality of pixels, each containing at least a photodiode and a transistor connected to data and scan lines. Other devices of the type to which the present invention pertains include CCD image sensors and CMOS image sensors, both of which being typically smaller than a-Si:H arrays. Diode-addressing-logic rather than transistor logic may also be employed to read out the a-Si:H array.

Radiation outside of the visible light spectrum cannot be directly detected efficiently by an a-Si:H sensor. Rather, the source radiation must be converted into visible light prior to its detection by the sensor array. This is accomplished by a scintillation layer, often disposed immediately adjacent to the sensor array. A scintillator, or scintillation layer, is a layer of material that emits optical photons in response to ionizing radiation. Optical photons are photons with energies corresponding to wavelengths between 3,000 and 8,000 angstroms. Thus, the scintillation layer converts source radiation energy, such as x-ray, into visible light energy, which may then be detected by the sensor array. Since the effect of a scintillation layer is typically to convert relatively few, high energy source photons into relatively many, low energy optical photons, such layers are also known as photomultiplier layers. When a scintillation layer is combined with a support layer (such as polyester film), the combination is known as screen or an x-ray intensifying screen.

Examples of scintillation layer material for this application include $GdO_2S_2$, CsI, CsI:TI, $BaSO_4$, $MgSO_4$, $SrSO_4$, $Na_2SO_4$, $CaSO_4$, BeO, LiF, $CaF_2$, etc. A more inclusive list of such materials is presented in U.S. Pat. No. 5,418,377, which is incorporated herein by reference. Commercial scintillation layers may contain one or more of these materials, and screens incorporating such mixtures are sold under the trademarks Trimax, from 3M Corp., Cronex, from Dupont Corp., and Lanex, from Kodak Corp.

Resolution is a critical criteria for any image capture device. In the case of devices of the type described above, a number of factors determine device resolution. However, the focus for the purposes of this description is on the effects the scintillation layer material and structure have on resolution. If a continuous, homogeneous scintillation layer is used, for example in devices in which one of the aforementioned commercial intensifying screens is applied directly over a sensor array, scattering and multiple reflections within the intensifying screen distribute the light energy from the point of generation. This results in a distribution of light over several or more discrete sensors, or pixels, and is referred to as an increase in the line spread function (LSF), and a degradation of the modulation transfer function (MTF). For a scintillation layer having an attenuation constant $\mu$, and thickness d, the MTF at spatial frequency ρ is the Fourier transform of LTF, and is given by [reference Albert Macovski, "Medical Imaging Systems," Prentice Hall, 1983, pp. 66]

$$MTF(\rho) = \mathcal{I}(LSF) = \frac{\mu}{(2\pi\rho + \mu)(1 - e^{-\mu d})}\left[1 - e^{-d(2\pi\rho+\mu)}\right] \quad (1)$$

FIG. 1 is an illustration of the effects of this distribution, showing those relevant portions of an image capture device 2, although not to scale. Device 2 includes a sensor array 12, having numerous pixels identified as $\mathbf{14}_{n-3}$, $\mathbf{14}_{n-2}$, $\mathbf{14}_{n-1}$, $\mathbf{14}_{n}$, $\mathbf{14}_{n+1}$, $\mathbf{14}_{n+2}$, $\mathbf{14}_{n+3}$ etc., and a continuous, homogeneous scintillation layer 22 disposed over array 12. A radiation source 24 emits radiation energy e, which may be partly or completely absorbed, scattered or transmitted by subject 26. Transmitted radiation energy is incident upon scintillation layer 22. When a photon from radiation source 24 excites material in scintillation layer 22, its energy is converted into optical photons, the extent of which may be detected by one or more of pixels $\mathbf{14}_n$ etc. The detection by pixels $\mathbf{14}_n$ etc. is read out and controlled by circuitry 16, which may, for example, cause the image to be displayed on a monitor 18 or the like (the details of which being beyond the scope of this invention).

Importantly, when the optical photons spread out and are scattered within scintillation layer 22 they are detected by more than one of pixels $\mathbf{14}_n$ etc. This effect is illustrated by the width w of the plot 4 of intensity versus position for a line of source photons striking scintillation layer material, referred to as the Line Spread Function, shown in FIG. 1. It will be appreciated that the narrower the width of such a plot, the narrower the distribution of the optical photons within the scintillation layer 22, and hence the better the resolution performance (image clarity and accuracy) of the device, since (a) the location of the point of incidence of the source radiation can be more accurately determined, and (b) the signal loss is reduced and a more accurate sensing of the energy of the optical photons can be made.

Table 1 list results of measured performance of various scintillation layers, and illustrates the tradeoff between resolution and efficiency, where $\eta=1-e^{-\mu d}$ is the fraction of incident x-ray photons that are absorbed by the scintillation material, and $\rho_{10\%}$ is the value of ρ such that MTF(ρ)/MTF (0)=10%. A known benefit of solid state image capture devices is the ability to obtain an image with a lower source radiation dosage than typical film image capture devices (i.e., x-ray). So, efficiency is a critical parameter for image capture devices, since a decrease in efficiency results in an increase of the required dosage of source radiation needed to obtain an image. The various scintillation layers in Table 1 are manufactured by Kodak, contain $GdO_2S_2$, and are sold under the trademark Lanex.

TABLE 1

| Screen | Film | η (55 KeV) | $\rho_{10\%}$(90 KeV) [$mm^{-1}$] |
|---|---|---|---|
| Fast | TMG | .75 | 3.0 |
| Regular | TMG | .58 | 3.5 |

TABLE 1-continued

| Screen | Film | η (55 KeV) | $\rho_{10\%}$(90 KeV) [$mm^{-1}$] |
|---|---|---|---|
| Medium | TMG | .41 | 4.3 |
| Fine | TMG | .18 | 8.8 |

There are several ways known to counteract the spreading out of the optical photons within scintillation layer 22. The first is to reduce the thickness d of the layer. This reduces the distance the optical photons may travel in the scintillation layer. However, the thinner the scintillation layer, the lower its conversion efficiency, since there is less scintillating material with which a source photon may collide. This thickness/resolution tradeoff is well known in the art. See, e.g., U.S. Pat. No. 4,069,355.

Another approach known in the art is to employ thallium doped cesium iodide (Csl:TI) as a scintillation layer. Csl:TI is deposited as a film in thickness up to 400 μm by a high temperature process such as vacuum sputtering. There is generally a relatively large mismatch between the thermal expansion coefficient of the substrate and of Csl:TI. As the two bodies cool, the stresses resulting from the mismatch cause micro cracks to form in the Csl:TI structure. These cracks run perpendicular to the plane of the deposited film, and are generally spaced apart by between 10 and 20 μm. The cracks form boundaries through which the optical photons do not pass. Thus, confinement structures are formed in the scintillation layer, and the Csl:TI layer may be made relatively thick without thereby degrading resolution. This type of structure, and indeed any in which the scintillation material confines the dispersion of optical photons in a direction in the plane of the scintillation layer, is referred to herein as a pixelized scintillator.

This approach has several disadvantages. First, Csl is a toxic material. And in fact, TI is a very toxic material. Thus, using such material presents environmental health and safety concerns, as well as special permitting requirements for facilities handling this material. Second, films of Csl:TI are very fragile, and special handling procedures must be employed during manufacture of the films and devices employing the films. Third, Csl:TI is hygroscopic. Water attracted by the film negatively effects luminescence. Thus, additional processing, use of desiccants, etc. are required.

An alternative to the basic Csl:TI application is the creation of physically isolated, columnar structures of scintillation material. There are numerous ways to accomplish this. For example, U.S. Pat. No. 3,041,456 teaches forming a layer of scintillation material, dicing said layer, and reassembling same such that the joints between adjacent die present an optical boundary. However, die cutting requires substantial handling and introduces manufacturing inconsistencies. Furthermore, resolution is limited due to the practical limit on the size of each die.

U.S. Pat. No. 3,936,645 teaches creating laser-cut slots between regions of scintillation material, and filling said slots with optically opaque material. U.S. Pat. No. 5,418,377 teaches laser ablation of a continuous scintillation layer to form discrete scintillation material regions. These laser processing techniques cannot produce acceptable resolution, however, as the limit of control of the laser is too large to obtain the desired region-to-region spacing. Furthermore, the ablation process produces debris which affects performance of the scintillation material and introduces region-to-region variation in response. Finally, the process is relatively complex, difficult to control, and expensive.

U.S. Pat. No. 4,069,355 teaches forming a pixelized scintillation layer by depositing Csl onto pads formed in or on a substrate. The Csl selectively grows on the pads to form columnar scintillation structures. U.S. Pat. No. 5,368,882 teaches forming scintillation material on mesas formed with sloped walls, again so that the scintillation material selectively grows in the form of columns. These alternatives also present significant problems. For example, the process of forming the pads is relatively complex, with numerous steps, introducing complexity and/or yield issues. Also, it is difficult to form such layers over regions larger than a few square inches. Lastly, because it uses Csl, it suffers from the disadvantages previously mentioned regarding that material.

U.S. Pat. No. 5,171,996, teaches forming depressions in etchable substrate material, such as glass, plastic, a ceramic, a thin metal layer such as Al or Ti, or crystalline or amorphous silicon or germanium. The surface of the etched substrate is then covered with scintillation material by vacuum deposition. Properties of the evaporation are used to confine the deposited material to columns located in the depressions etched 5–20 μm into the substrate. The columns then extend out of the depressions by 300–1000 μm. The depth of 5–20 μm of the depression is carefully controlled as required by the deposition process taught by the reference to allow the scintillation material to be selectively deposited therein. Should, for example, the depression depth exceed the specified 20 μm, the process results in the deposition of the scintillation material not only in the depressions, but also on the ridges (element 16 in the reference) between the depressions. This reduces the effective separation between columns of scintillation material (element 19 in the reference), resulting in the problems associated with continuous films of scintillation material, such as loss of resolution, etc., since the reference relies on the air or vacuum gaps (elements 20 in the reference) to isolate the columns.

Accordingly, there is a need in the art for an improved pixelized scintillation layer providing high resolution, high conversion efficiency, environmental safety, ruggedness, and an improved method for making same.

SUMMARY

According to the present invention, an improved pixelized scintillation layer and x-ray intensifier screen is provided, having a body structure composed of plastic (such as PMMA), metal (such as Al), or semiconductor (such as Si) in which are formed a large number of relatively deep, closely spaced apart wells, vias, channels or similar openings. These openings are filled with a scintillation material which converts source photons of a selected energy into optical photons.

Various embodiments are presented for treating the body structure to create the aforementioned openings. According to a first embodiment, a body structure is photolithographically etched to form a plurality of small-diameter, deep wells which may be filled with scintillation material. According to another embodiment, suitable body structure material may be plasma etched to produce wells. According to yet another embodiment, an appropriate material such as aluminum may be anodically etched to produce a porous structure having suitable wells. According to other embodiments, each of the aforementioned methods may be employed to create vias entirely through the body structure. According to still other embodiments, each of the aforementioned methods may be employed to create channels running parallel or orthogonally in the surface of the body structure.

In addition to the various methodologies of these embodiments, it will be appreciated that many of the techniques employed by such methodologies are well understood, economical, controllable, and reproducible. Thus, structures with consistent geometries and performance may be produced in a cost-efficient manner. Yield may also be improved over the prior art techniques.

In addition to the various methodologies of these embodiments, differing materials or combinations of materials may be employed as body structures, the choice of such materials or combinations limited only by the compatibility of a selected process with a chosen material or combination.

In addition to the various methodologies and materials, the body structures in the various embodiments may be of the single-use type (i.e., the final structure being a combination of body structure and scintillation material), or the body structure may form a reusable mold which is separated from a cast scintillation structure prior to use in a complete system.

Wells formed in a body structure may then be filled with scintillation material by one or more of a variety of processes. For example, a liquid or powder dispersion containing scintillation material may be applied to the body structure such that the material settles into and fills the wells. A wide variety of scintillation materials may be employed, but ideally environmentally safe materials may be chosen to avoid the disadvantages of toxic substances such as CsI:TI.

Scintillation layers according to the present invention find particular utility in image capture devices of the type described above. In particular, a structure is provided which, when positioned over a typical a-Si:H sensor array, provides multiple columns of scintillation material over each discrete a-Si:H sensor to improve resolution and reduce the registration requirements between the scintillation layer and the sensor array. Alternatively, the scintillation layer may be placed over a typical photographic film which film, following exposure by the scintillation material, may be removed and developed to produce an image. Each column is relatively optically isolated from one another to provide the improvement of reduced spreading of the optical photons in the scintillation layer.

Thus, the advantages provided by the present invention include, but are not limited to, improved resolution, large-area, consistent and economical manufacturing processes, selectivity of scintillation material (for example to avoid use of toxic or expensive substances), physically robust structures, reduced requirement for registering the scintillation layer with the sensor array, etc.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

FIG. 2 is a cross-sectional illustration of a scintillation structure according to one embodiment of the present invention.

FIG. 3 is a cross-sectional illustration of an image capture device incorporating a scintillation structure according to the present invention.

FIG. 6 is an image capture device formed by a process such as that illustrated in FIG. 5.

FIG. 7 is an illustration of the steps of forming an image capture device according to a second embodiment of the present invention, namely involving the etching of a polymer body material.

DETAILED DESCRIPTION

Figure 1:
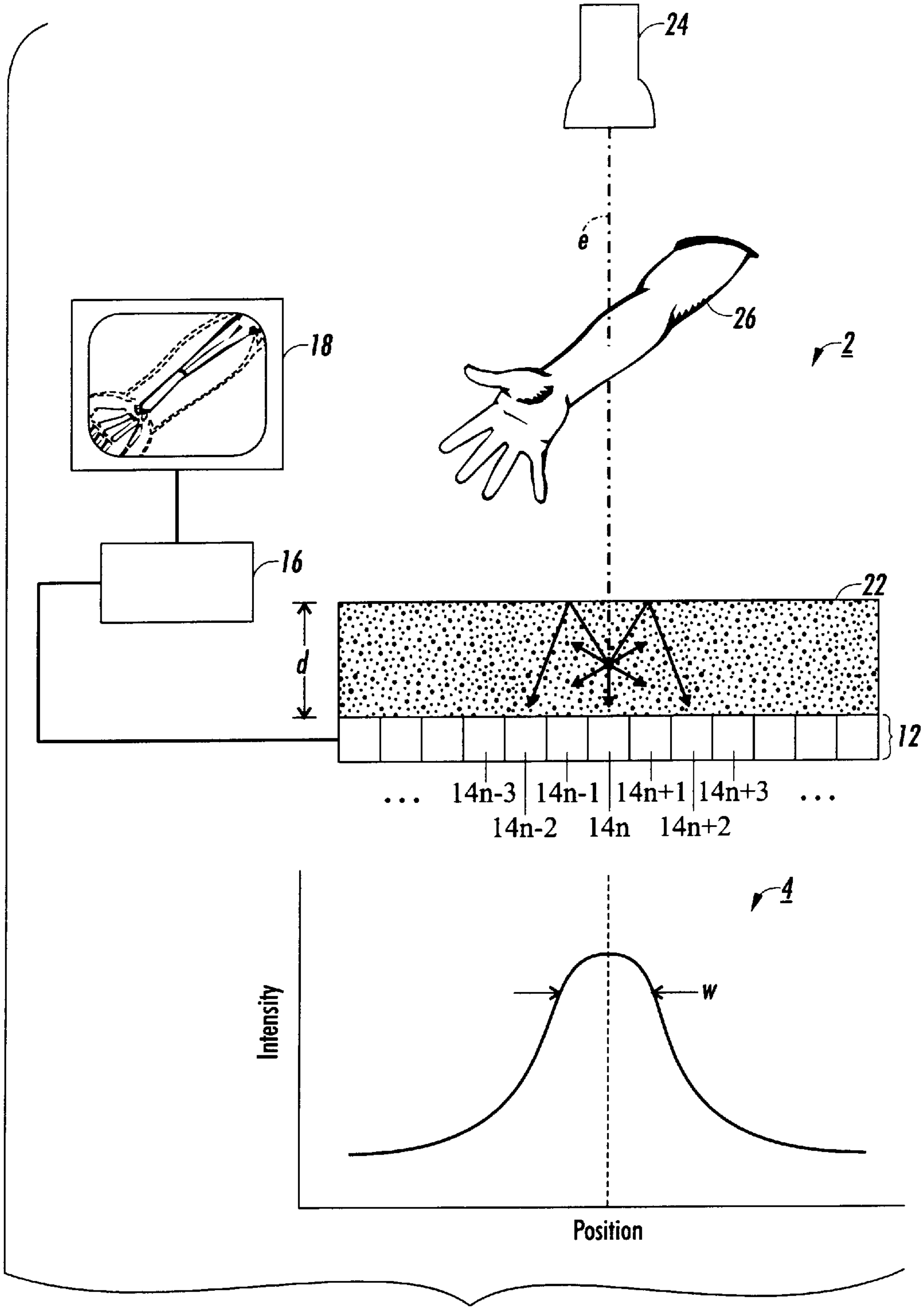
FIG. 1 Prior Art
FIG. 1 is an illustration of a prior art x-ray image capture device, and a plot of intensity versus position performance thereof.

In the following detailed description, numeric ranges are provided for various aspects of the embodiments described, such as well pitch, depth, deposition temperatures, etc. These recited ranges are to be treated as examples only, and are not intended to limit the scope of the claims hereof. In addition, a number of materials are identified as suitable for various facets of the embodiments, such as for a body, scintillation layer, etc. These recited materials are also to be treated as exemplary, and are not intended to limit the scope of the claims hereof.

One embodiment of a scintillation structure 30 according to the present invention is shown in FIG. 2. Structure 30 consists of a body 32 having openings therein, comprising a plurality of walls 34 defining wells 36 therebetween. Disposed within wells 36 is scintillation material 38, such that columns 40 of scintillation material are formed and connected by a scintillation material base 42. It will be appreciated that while the present discussion focuses on the openings in structure 30 being wells extending part way therethrough, the openings may also be vias extending entirely therethrough, as further discussed below.

Columns 40 are spaced apart by a distance p, referred to as pitch, of 3–20 μm. Current pixel dimensions are between 80–500 μm, so this pitch allows for 1–30,000 columns per pixel. The pitch of columns 40 is limited by several parameters, including the thickness g of walls 34, which is not more than about 50 μm. Thickness g of walls 34 is controlled by the process used to form the wells 36, as further discussed below.

The overall thickness t of the scintillation material layer is calculated as the height $t_1$ of the columns 40 plus the thickness $t_2$ of the scintillation material base 42. A target for the total thickness $t=t_1+t_2$ is on the order of between 300 μm and 1000 μm, preferably at the thicker end of the range. (While columns 40 are shown in FIG. 2 to stop short of going entirely through body 32, as described further below, it may be desirable for columns 40 to extend entirely through body 32.) The scintillation material base 42 is a continuous layer of material that can improve the x-ray capture efficiency at the expense of some resolution. The height $t_1$ of the scintillation material columns 40 may be optimized for a given thickness t, which maximizes the conversion efficiency and resolution of the scintillation layer.

Ultimately, the structure shown in FIG. 2 is inverted, and integrated into an image capture apparatus 42, as illustrated for example in FIG. 3. Structure 30 is first pressed to an image sensor such as film, or bonded to a sensor array 44 by optical grease, index matching fluid, or some other appropriate adhesive. Sensor array 44 comprises a plurality of individual sensor pixels 46, 48, 50, etc., typically formed of a-Si:H as well known in the art. See for example, R. L. Weisfield, R. A. Street, R. B. Apte, A. M. Moore, "An Improved Page-Size 127 μm Pixel Amorphous Silicon Image Sensor for X-Ray Diagnostic Medical Imaging Applications," *SPIE Medical Imaging* 97, February 1997, San Jose, Calif., which is incorporated herein by reference. Sensor pixels 46, 48, 50, etc. are in electrical communication with control circuitry 56, which reads out data from the pixels, etc., and which may cause the data thereby read to be displayed on a monitor 58 or otherwise be processed.

Body 32 is selected of a material transparent to source radiation e. Preferably, the material of body 32 is also reflective to the optical photons generated by scintillation material 38 and to visible light in the environment in which the completed device operates. Enhanced light guiding as well as optical isolation from the ambient environment is thereby provided over structures such as those taught in U.S. Pat. No. 5,171,996, in which the gap between adjacent columns is filled with air or a vacuum. For example, when optical photons strike the walls of the columns of a structure manufactured in accordance with the aforementioned patent at or above an angle referred to as the critical angle, the photons pass through the walls and through the air or vacuum gap between columns, and enter adjacent columns. This degrades resolution for the reasons previously discussed.

It is therefore desirable to provide reflective material between the columns which prevents photons from entering adjacent columns, regardless of the angle at which the photons strike the walls. For a source radiation of x-rays, and optical photons in the visible spectrum, body 32 may suitably be fabricated from alloyed or pure aluminum. However, given the various requirements discussed herein, it is within the scope of one skilled in the art to identify and select other appropriate materials for body 32.

The bond between structure 30 and array 44 is such that light from the environment in which the device operates should also be prevented from reaching pixels 46, 48, 50, etc., and a minimum of reflection occurs as optical photons travel from scintillation structure 30 to array 44. To this end, it may be desirable to include an index matching layer (or antireflection) layer 45 between structure 30 and array 44. Layer 45 may be on the order of 500–1500 nm thick, and may be deposited by evaporation, spin coating, dry film, or other deposition process. The material of layer 45 should have an index match to reduce or prevent reflection of the optical photons at the boundary between structure 30 and layer 45, and exemplary materials include $SiO_2$, $Al_2O_3$, $TiO_2$, other oxides, polyamide, photoresist, etc. Layer 45 may be prebonded to either structure 30 or array 44, or otherwise formed between layer and array 44.

Figure 4:
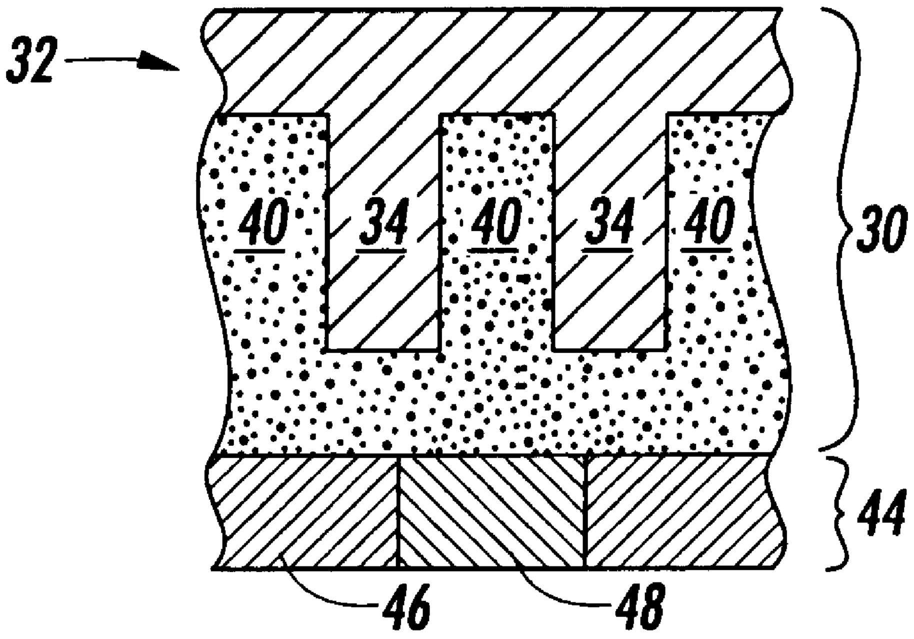
FIG. 4 is a cross-sectional illustration of an image capture device incorporating a scintillation structure according to the present invention in which there is a 1:1 correspondence between the pixels and columns of scintillation material.

In the embodiment shown in FIG. 3, multiple columns 40 are positioned over, and thus correspond to a single pixel 46, 48, etc. of the sensor array 44. For this reason, in this embodiment precision alignment is not required between the screen and the sensor array 44 (or film). An alternative embodiment is shown in FIG. 4, in which each column 40 is aligned over, and thus corresponds to a single pixel of the sensor array 44 (or film).

Figure 5:
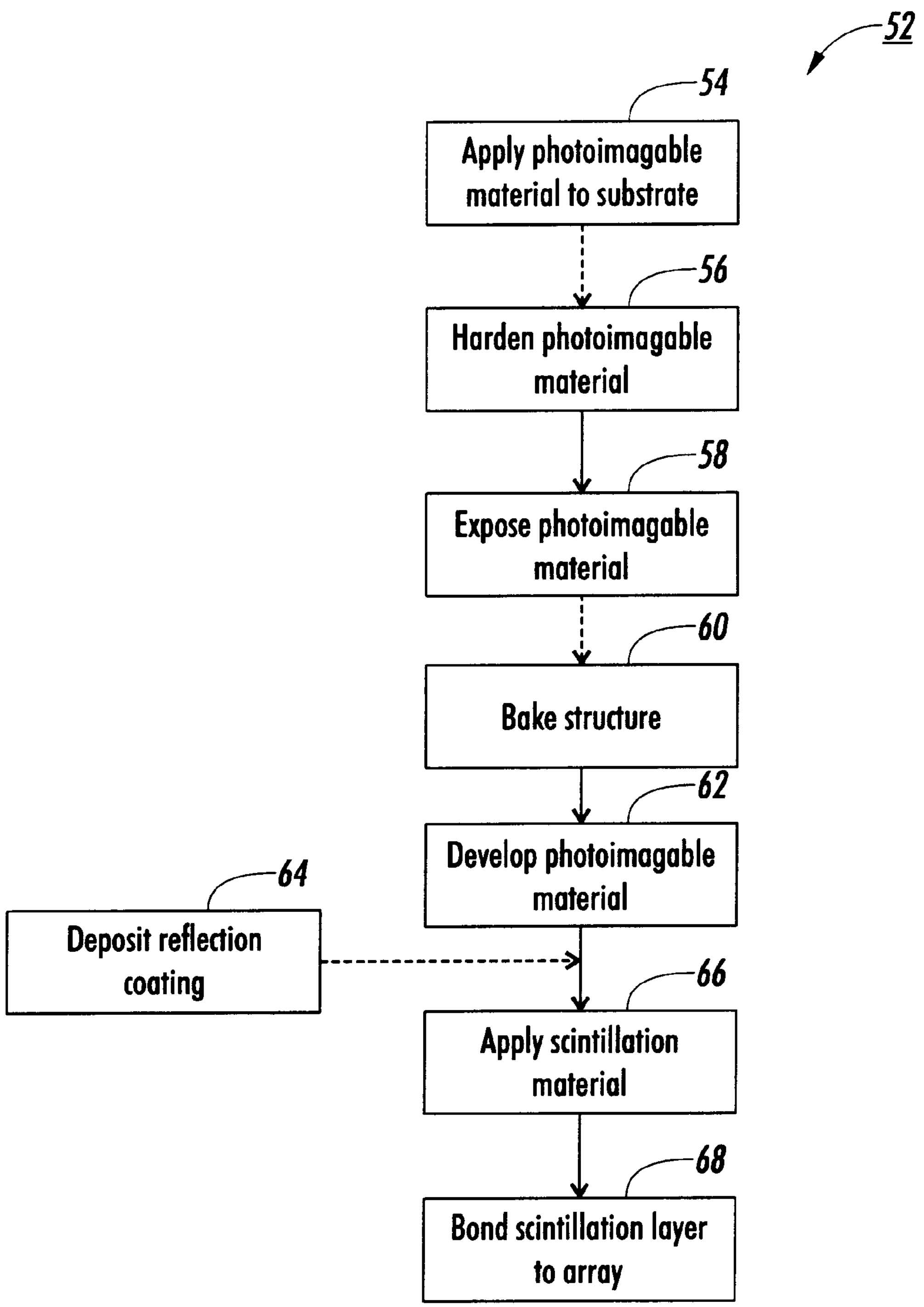
FIG. 5 is an illustration of the steps in the process of forming an image capture device according to one embodiment of the present invention.

A number of techniques are presented for the fabrication of a scintillation structure according to the present invention. The first involves employing a photoresist to form wells 36 in a body 32. With reference to FIG. 5, according to one embodiment 52 of the present invention, one or more layers of a photoimagable material such as SU-8 photoimagable epoxy (manufactured under the trademark EPON by Shell Chemical Company) are applied to a substrate that is transparent to x-rays, such as plastic, Al, or Si. This is shown at step 54. At step 56, the photoimagable material is hardened, if necessary. For example, the SU-8 is baked at 95° C. for 3 hours. At step 58, a reticle that locates the wells is then used to expose the photoimagable material, for example at 800 $mJ/cm^2$, $\lambda=400$ nm. Following a 30 minute, 95° C. postbake at step 60, needed in the case of the SU-8 material, the photoimagable material is developed at step 62, for example for 30 minutes in propylene glycol methyl ether acetate (PGMEA) to form the wells therein.

Reflectivity to optical photons is enhanced by depositing a reflective coating over the surface of the wells. This optional step 64 (shown as optional by the dashed line connecting the step to process 52) may be achieved by aluminum evaporation, electrochemical deposition, or similar technique. Particulate scintillation material dispersed in a solvent/binder is then applied to the wells at step 66 such that the wells are filled with scintillation material and binder. Excess scintillation material/binder may optionally be removed. (The phosphor deposition steps are not shown in FIG. 5, but are discussed in further detail below). After the solvent evaporates, the completed screen is then bonded to the array with an appropriate adhesive (or mated with a film). The completed structure 70 according to this embodiment is shown in FIG. 6, which is similar to the structure shown in FIG. 3 with the addition of optional reflective coating 72 located between body 32 and scintillation material 38. It should be appreciated that the reflective coating shown applied in this embodiment may be applied to any of the embodiments shown and/or described herein, and will accordingly not be further illustrated.

Figure 8:
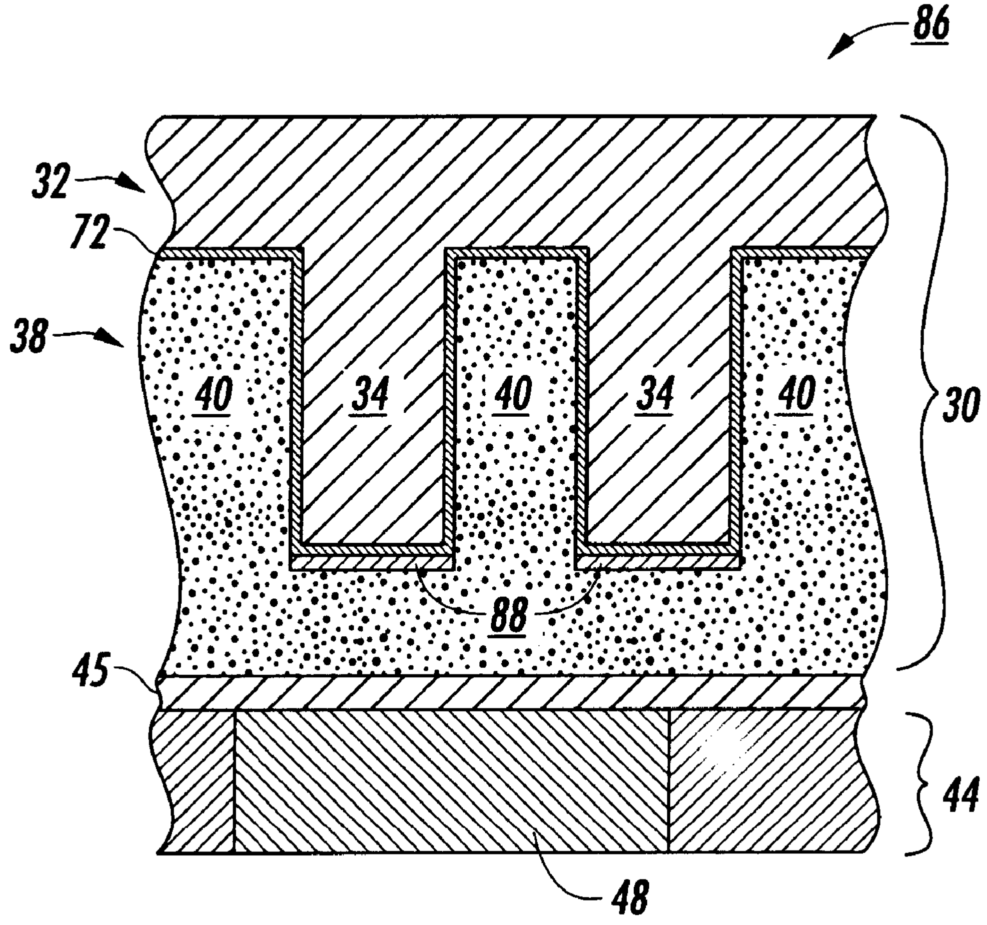
FIG. 8 is an image capture device formed by a process such as that illustrated in FIG. 7.

A second technique which may be employed to form wells 36 in a body 32 is the etching of a suitable body material such as polymethylmethacrylate (PMMA), polytetrafluoroethylene (PTFE) or other similar polymer as shown in FIG. 7. One embodiment of the resulting structure is shown in FIG. 8. According to one embodiment 74 (FIG. 7) of the present invention a body of PTFE is masked at step 76 with a metal mask using techniques know to those skilled in the art. The body 32 and portions of the mask material 88 remaining after developing are shown in FIG. 8. Masked, thermally assisted ion beam etching is then used to form the wells in the PTFE substrate, as described in Berenschot, E., Jansen, H., Burger, G.-J., Gardeniers, H., Elwenspoek, M., Proc. IEEE Micro Electro Mechanical Systems, San Diego, Calif., 11–15 Feb. 1996, 277–84, incorporated by reference herein. To improve optical efficiency, the etched polymer may be provided with a reflective surface coating at step 80, for example by vacuum depositing 0.1–2 μm aluminum. This reflective coating 72 is shown in FIG. 8. In one embodiment, the masking material 88 may be left in place, and scintillation material 82 applied to the wells formed in the substrate. Alternatively, the masking material 88 may be removed prior to application of the scintillation material. The resulting structure according to this embodiment would be similar to that shown in FIG. 6. In either case, wells 36 are formed in body 32 with a depth of between 300 μm and 700 μm, and a pitch of between 100 μm and 200 μm, preferably around 127 μm.

Figure 9:
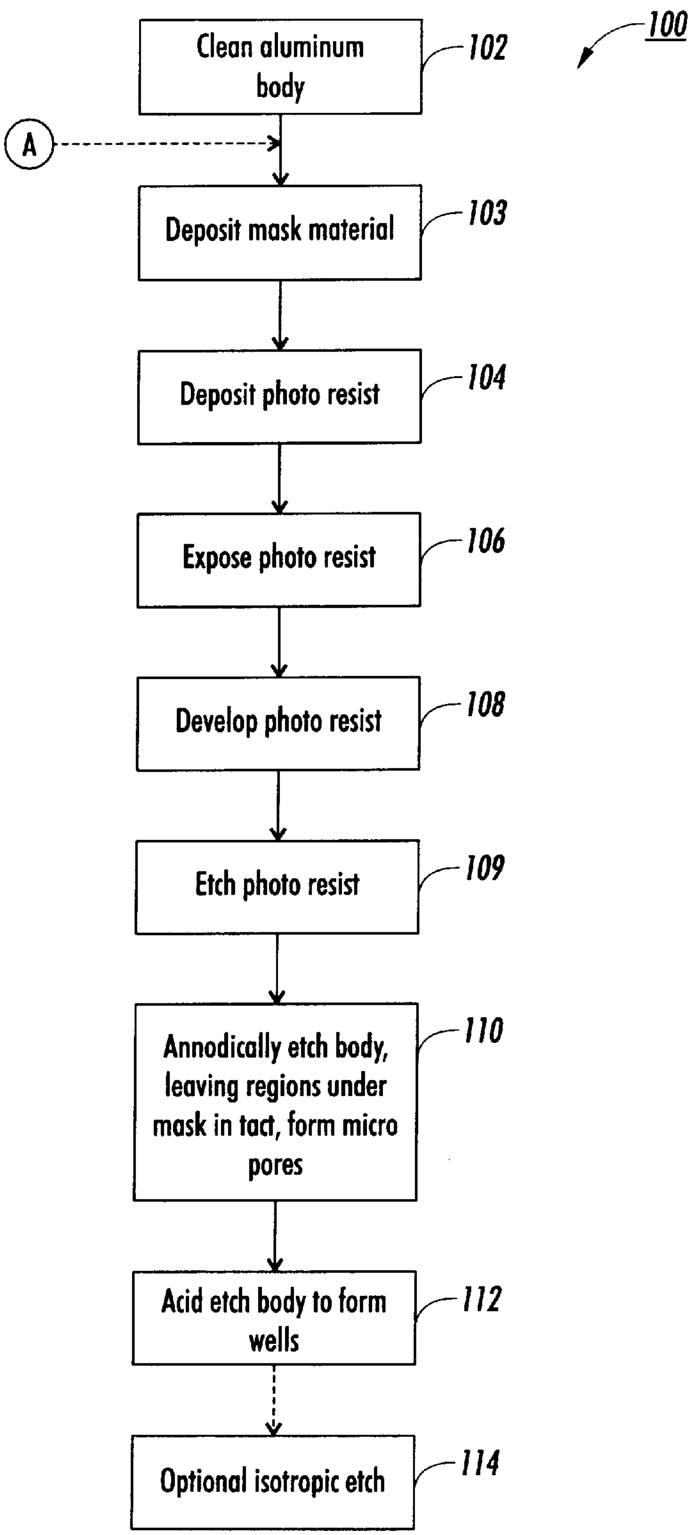
FIG. 9 is an illustration of the steps of forming an image capture device according to a third embodiment of the present invention, namely involving etching a suitable body material to produce micropores, then removing the walls between the micropores to produce wells.
Figure 10:
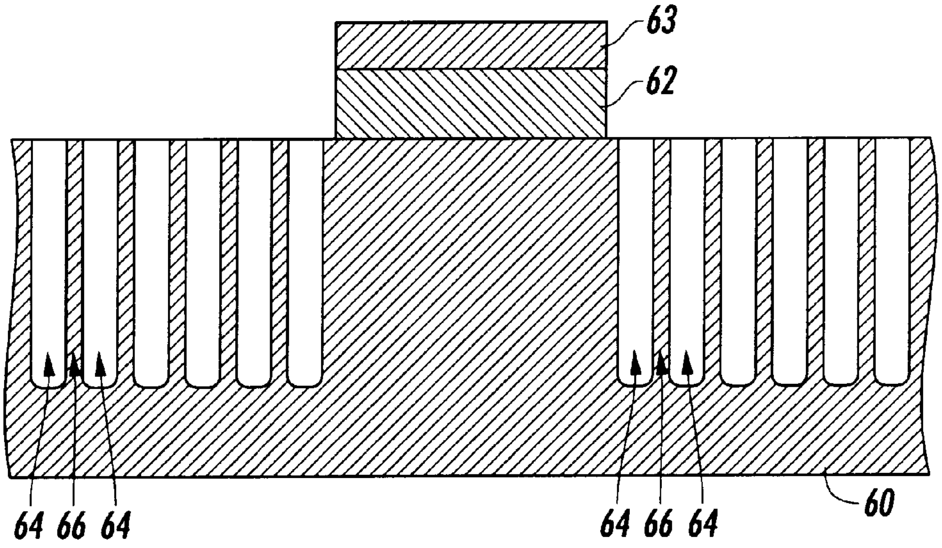
FIG. 10 is a cross-sectional illustration of a body structure part way through the process illustrated in FIG. 9.

A third technique which may be employed to form wells 36 in a body 32 is anodic etching of a metal body such as aluminum. As illustrated in FIG. 9 and FIG. 10, the process 100 begins first with the cleaning of an aluminum body 60 for example by solvents, electropolishing, or other method known in the art, as shown at step 102. A masking material 62 such as silicon nitride, silicon oxide, W, Cr, Ti, or other metal, ceramic, etc. is then deposited at step 103 on the aluminum by vacuum deposition. A suitable photoresist material 63 such as Shipley 1818, or other material known in the art, is next deposited onto the mask material, as shown at step 104. Photoresist 63 is next exposed then developed to form a pattern which will ultimately define wells and the pitch therebetween. This is shown at steps 106 and 108 of FIG. 8. The masking material is etched at step 109 with a wet or dry etch known in the art to expose the areas of the aluminum body in which the wells will be formed.

As shown at step 110, the body structure with patterned photoresist or other masking material is next anodically etched in a temperature controlled bath, for example in accord with the following conditions 40° C., 60 mA/cm$^2$ in a 10% solution of dilute oxalic, sulfuric, or phosphoric acid. As shown in FIG. 10, the resulting structure is comprised of body structure 60 having a plurality of narrow, deep cavities referred to herein as micropores 64 separated by thin walls 66, except under mask 62 and photoresist 63, where body 60 remains intact. This is an intermediate step in the process, since the micropores will typically have a diameter of 0.1 μm or less, which is far too small for the adequate introduction of scintillation material in subsequent processing steps and too small for adequate performance in a scintillation layer.

Figure 11:
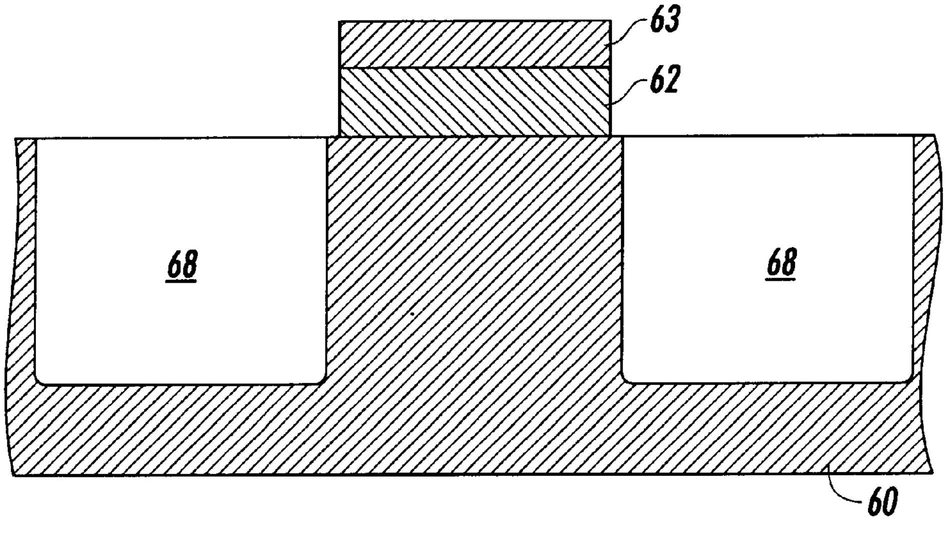
FIG. 11 is a cross-sectional illustration of a body structure at a different point in the process illustrated in FIG. 9.

Conveniently, thin walls 66 between micropores 64 may be removed to create larger diameter wells. Thin walls 66 will be comprised of aluminum oxide, due to the anodic etching of step 110. Oxide etching with a 6:1 dilution of buffered oxide etch or other oxide etch known in the art may then be employed to selectively remove the thin walls 66, as shown at step 112. Several possibilities are present as regards the mask material 62 and photoresist 63 at this point. First, the etching performed to remove walls 66 may also remove the mask 62 and/or photoresist 63. The mask 62 and/or photoresist 63 may otherwise be deliberately removed in a separate step (not shown) if necessary. Alternatively, the ask 62 and/or photoresist 63 may be left in place. This later case is shown in FIG. 10, in which body 60 has formed thereon mask 62 and photoresist 63, and in which are formed wells 68. The diameter of wells 68 are on the order of 10–200 μm. The depth of wells 68 is on the order of 500 μm or deeper. Wells 68 may optionally pass though the body material (not shown, but described further below) or be blind (as shown in FIG. 11).

In certain circumstances, it may be desirable to reduce the surface roughness of the resulting structure. Reasons for doing this include improving the efficiency with which optical photons are guided to the image sensor. Step 114 may thus be optionally employed to reduce the surface roughness of body 60. An isotropic etch may be used to perform this step, and an example of a suitable etch process using $BCl_3$ is given in S. M. Cabral et al., "Characterization of a BCI, Parallel late System for Aluminum Etching," Proc. Kodak Microelectronics Seminar, pp. 57–60, Dallas, 1981. Step 114 is optional, as indicated by the dashed line connecting it to the previous step.

Importantly, each of the aforementioned processes are capable of producing a structure with similar physical attributes. For example, each may produce a body in which are formed a plurality of wells in which scintillation material may be introduced. These wells may be on the order of between 10 200 μm or larger in diameter, for example 20 μm, between 100–1000 μm deep or deeper, for example 500 μm, and may have a pitch of 12 μm–2 mm, for example 127 μm. The ratio of diameter of the wells to the depth of the wells is referred to as the aspect ratio of the wells. A desirable, but exemplary aspect ratio for a structure produced by any of the aforementioned processes would be 50:500.

Figure 12:
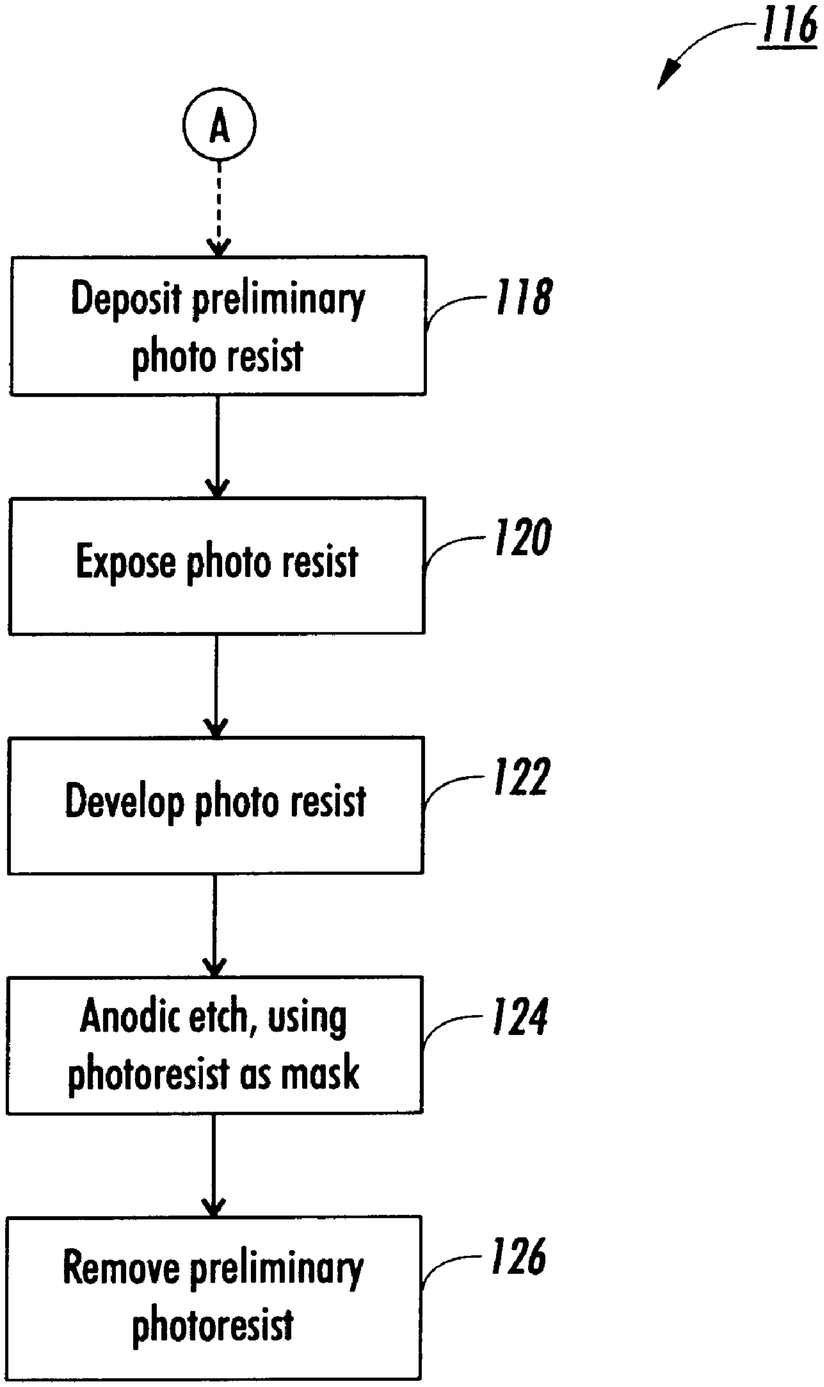
FIG. 12 is an illustration of an optional set of steps forming seed pores for the process illustrated in FIG. 9.
Figure 13:
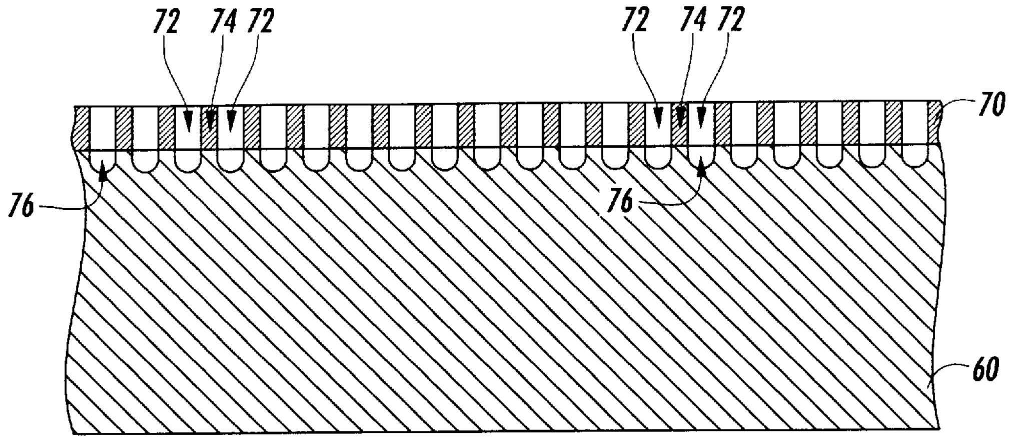
FIG. 13 is a cross section of a body structure part way through the process of FIG. 12.

It may be desirable under certain conditions to provide control over the uniformity and distribution of micropores 64. One method to accomplish this, which may serve as a starting point for process 100 is shown in FIG. 12, and the resulting structure is shown in FIG. 13. According to process 116, following the cleaning of aluminum body 60 at step 102 (shown in FIG. 9), a preliminary photoresist layer 70 is deposited over body 60. This is shown at step 118 of FIG. 12. Preliminary photoresist layer may be formed of Shipley 1818, or other material well known in the art. Preliminary photoresist layer 70 is exposed and patterned, for example using interference patterns of laser beams or other process, preferably one able to produce a pitch of p=0.005–1.0 μm, to form a mask for creating seed pores 76 in body 60. This is shown at steps 120 and 122 of FIG. 12. The patterned preliminary photoresist layer 70 is shown in FIG. 13, wherein steps 120 and 122 have formed vias 72, separated by resist walls 74. Anodic etching is then performed to form seed pores 76, which will be used to form micropores 64. This is shown at step 124. Preliminary photoresist layer 70 is then removed, as shown at step 126. Process 100 is then performed from steps 104 on, as illustrated in FIG. 9.

Reference has been made above to the introduction of an appropriate scintillation material into a body structure. The technique used to deposit the scintillation material is defined for the purposes hereof as "physical deposition", and includes settling, doctor-blading, in situ chemical processes, or other non-vacuum deposition technique.

For example, a scintillation material dispersion may be obtained by combining a scintillation material powder, an optional binder material, and a solvent. The purpose of the binder is to adhere the scintillation material to the body and within the wells. The purpose of the solvent is to provide the scintillation material/binder in a liquid state to facilitate its application to the body. Once applied, the solvent is evaporated (with optional heating to encourage the evaporation) to leave the solid scintillation material/binder permanently affixed to the body. An example of a suitable scintillation material is Type 2611 Luminescent Material made by Osram Sylvania, Towanda, Pa. Examples of binders include cellulose nitrate, sold under the trademark Parlodian by Fisher Scientific Co, and methyl/butyl methacrylate sold under the trademark Elvacite (grade 2016) by Dupont. Examples of solvents include water, amyl acetate, acetone, and alcohols.

While ratios of these materials are discussed in the art (for example in Wowk and Shalev, Med. Phys. 21 (8), August 1994, pp. 1269–1276), the present application provides a desirable condition of requiring less solvent that prior art applications. This is due to the mechanical application of the scintillation material taught by the present invention, as compared to the liquid float application needed for a planar surface, as taught by the prior art. The advantage provided is less, cost, less waste, less residual material from evaporation, fewer voids in the solid scintillation material left from evaporated material, etc.

In one embodiment, the scintillation material, binder, and solvent are mixed into a paste-like consistency. The mixture is trowelled onto the top surface of the body and into the wells. Effort is made to provide a planar surface of scintillation material to bind to the array or optional antireflective index matching layer. A planar surface is important for several reasons, including: greyscale calibration for sensor-to-sensor uniformity; image clarity due to limiting of scattering from pixel to pixel; providing adequate index matching to reduce reflection at scintillation material/array interface; etc. To this end, trowelling may take place in a mold, with the mold sides used as guides for the trowel. A very liquid dispersion may be employed to float a self-leveling planar surface, as taught by the prior art. Optionally, once the solvent is evaporated, and the scintillation material/binder is hardened, the surface of scintillation material may be planarized by lapping techniques well known in the art.

In the present invention, the 300–1000 $\mu$m deep wells serve several distinct functions. First, they act as molds for the physical deposition of scintillation material. Second, the walls of the depressions serve to reflect optical photons and thus guide them within the scintillation material column.

Figure 14:
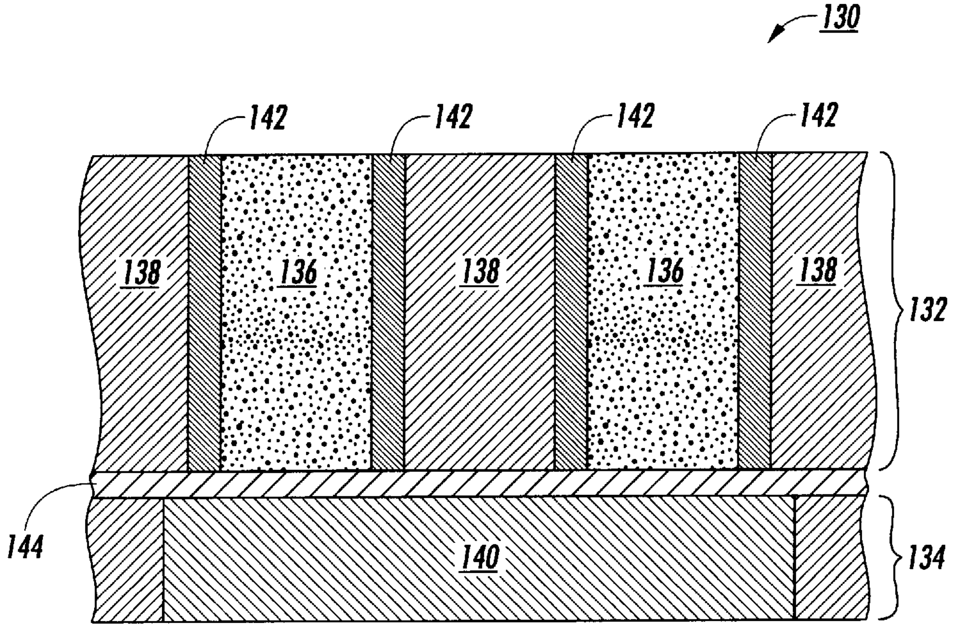
FIG. 14 is a cross section of a body structure in which the openings in the body structure are vias extending entirely through said body structure.

An alternative structure providing each of these two functions is a body in which is provided vias, as opposed to wells. This is illustrated in FIG. 14, in which body 132, disposed over array 134, is provided with a plurality of vias 136 filled entirely with scintillation material suspended in a binder which extend entirely therethrough. Vias 136 are separated by walls 138, which may optionally have a reflective coating 142 on their inner surfaces for the reasons previously described. Again, the need for alignment of the vias over a pixel, for example pixel 140, will depend on the pitch of the vias 136. And again, an optional index matching antireflective coating 144 may be disposed between body 132 and array 134.

Figure 15:
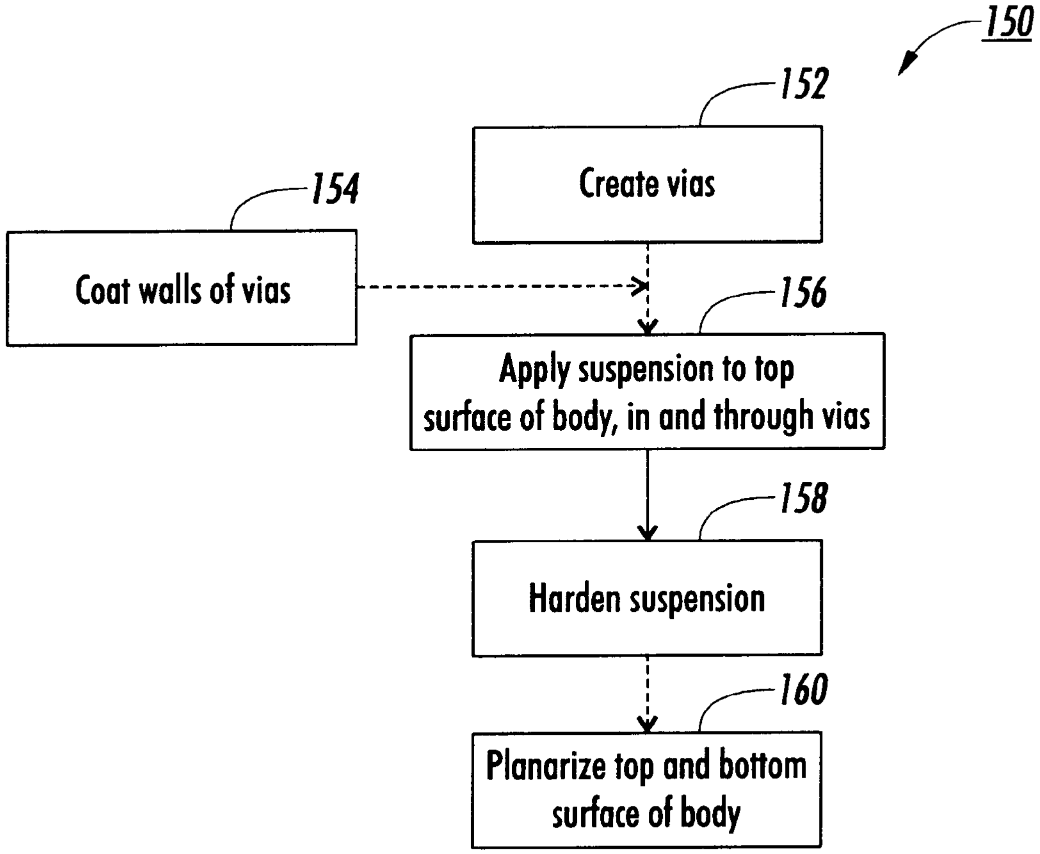
FIG. 15 is an illustration of steps which may be employed to form a structure of the type illustrated in FIG. 14.

The process involving forming the vias with scintillation material therein is illustrated in FIG. 15. At step 152, vias are formed entirely through the body (extending from a first surface called the top surface to a second surface called the bottom surface) by any of the aforementioned processes. Optionally at step 154, the walls of the vias are coated with a reflective material. At step 156, the suspension containing the scintillation material is next applied to the body and in and through the vias, ideally such that the suspension passes from the top surface through the vias to the bottom surface. At step 158, the solvent in the suspension is evaporated thereby hardening the scintillation material and permanently bonding it in place on the top and bottom surface and completely filling the vias. At step 160 the top and bottom surfaces are planarized. The top surface may optionally be coated with reflective material. The advantage provided by this embodiment is that the likelihood of an air pocket in the wells described above preventing scintillation material from fully filling the wells is reduced or eliminated.

In either case, the planform (axial view) of the wells or vias may be one of a variety of shapes such as circular, square or rectangular, triangular, hexagonal, etc. Such shapes are illustrated and discussed in U.S. Pat. No. 5,171,996, which is incorporated by reference herein.

Figure 16:
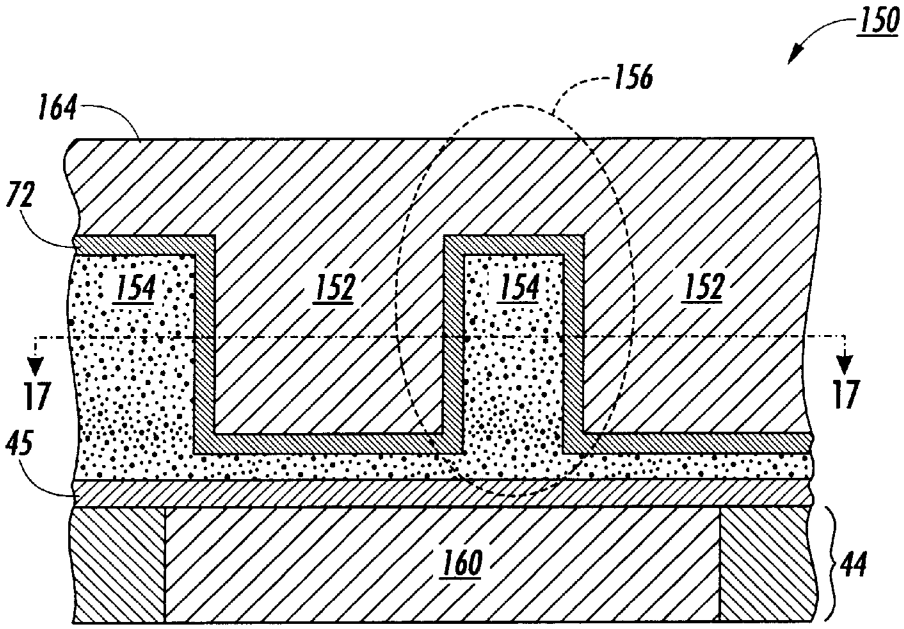
FIG. 16 is a cross section of an image capture apparatus of the type in which the openings in the body structure are channels formed in a surface of the body structure.
Figure 17:
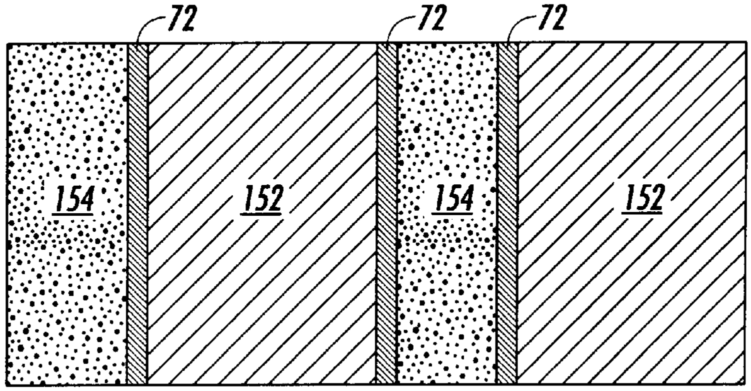
FIG. 17 is a cut-away top view of the image capture apparatus illustrated in FIG. 16.
Figure 18:
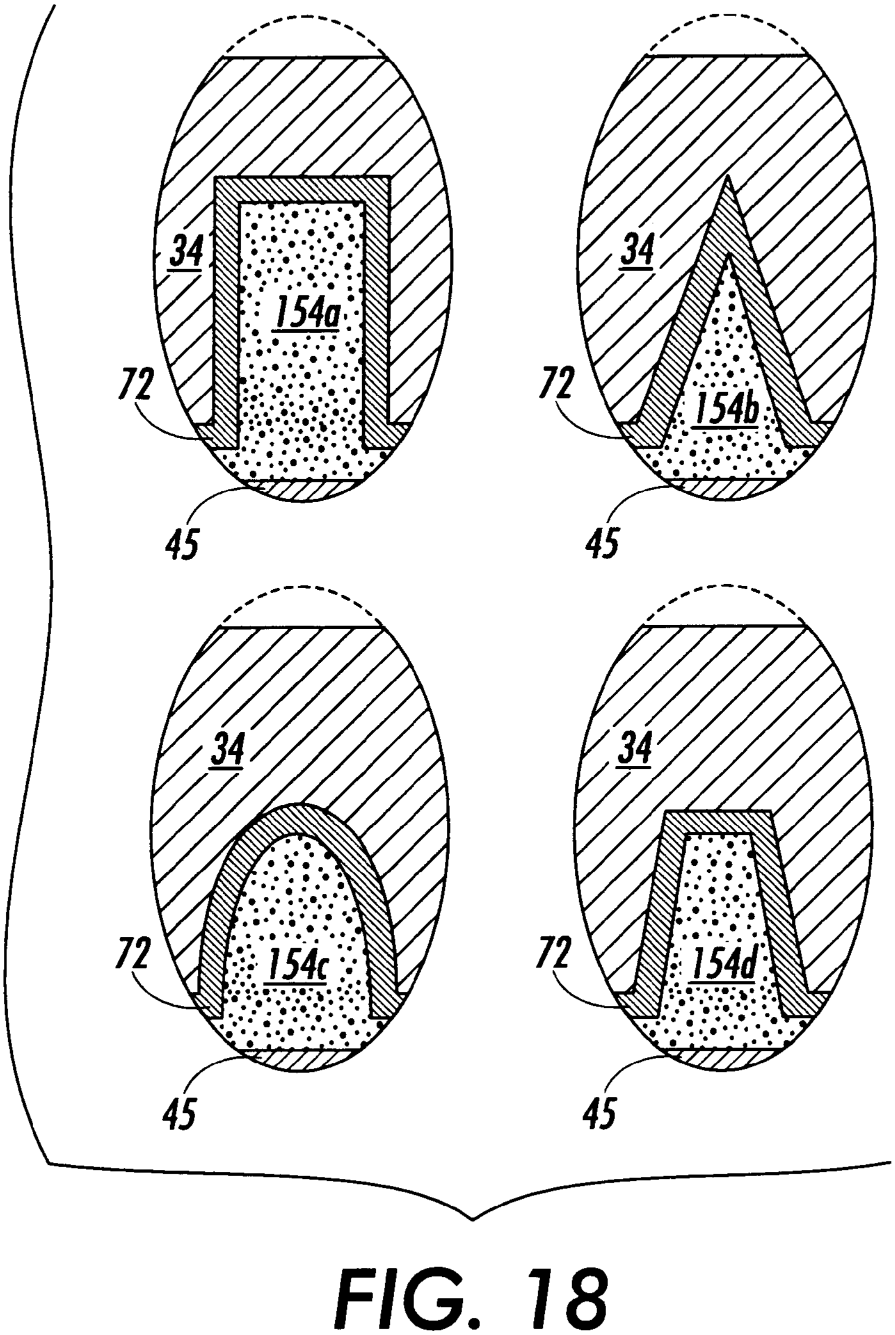
FIG. 18 is an illustration of various cross sections (axial views) of channels of the type which may be formed in an image capture apparatus similar to that illustrated in FIGS. 16 and 17.
Figure 19:
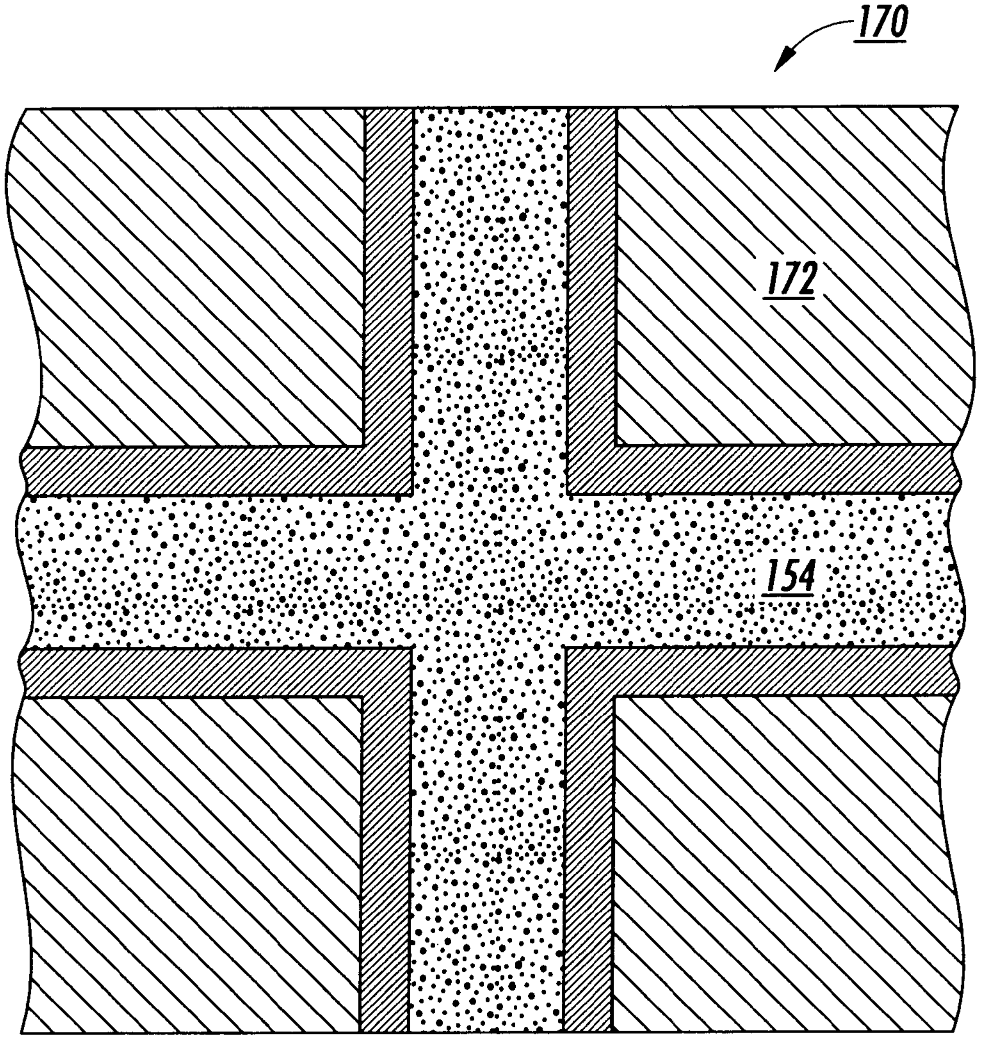
FIG. 19 is a bottom view of an image capture apparatus having orthogonally intersecting channels, formed in a surface of a body structure, and in which is disposed scintillation material.
Figure 20:
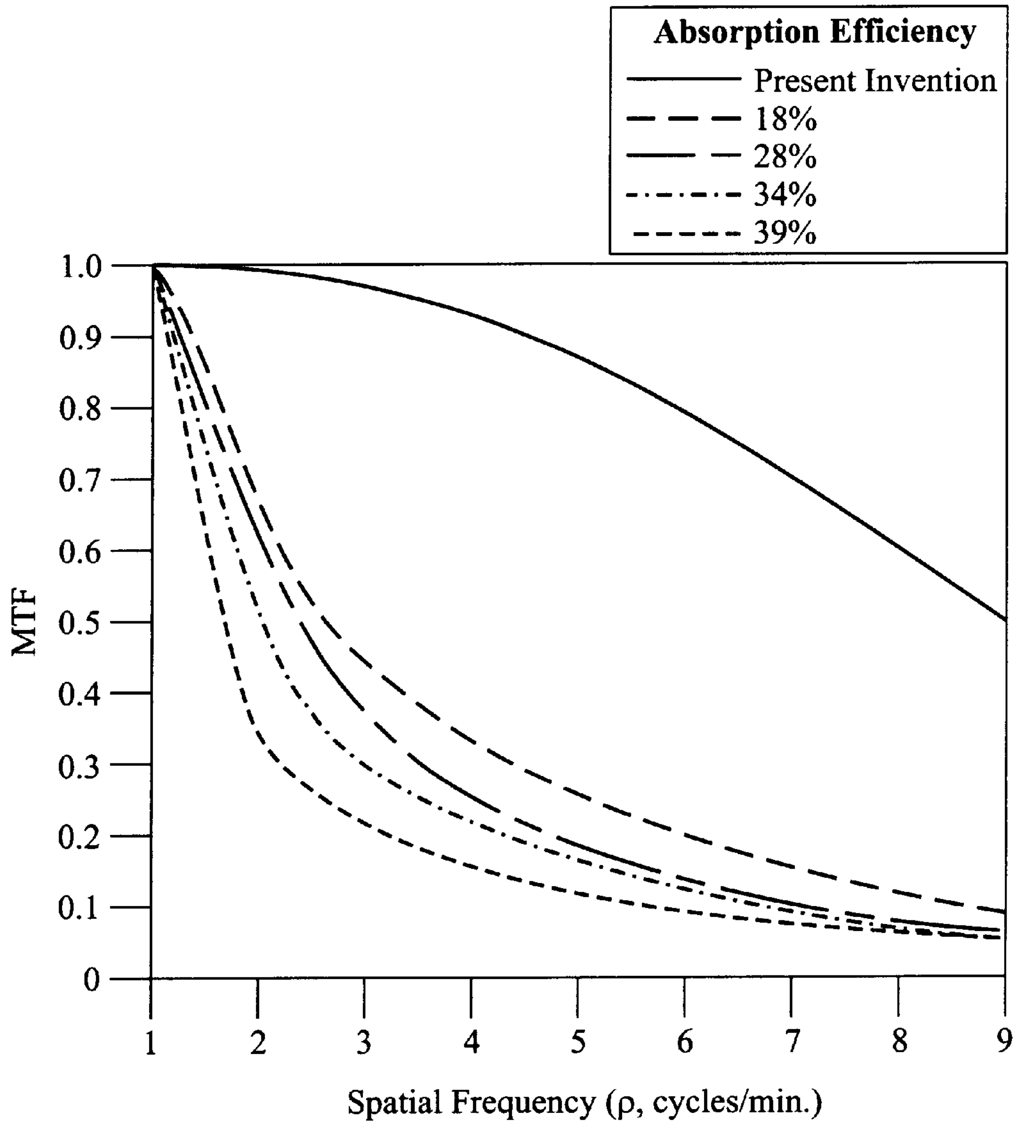
FIG. 20 is a plot of spatial frequency verses MTF for modeled prior art devices having various efficiencies and for a modeled device in accordance with the present invention having an efficiency of 50%.

A further alternative structure is provided by forming in a body channels as opposed to wells or vias. This is illustrated in FIGS. 16 and 17, in which a body 164 is provided with a plurality of channels 154 into which is deposited scintillation material as previously described. This embodiment will characteristically be associated with a 2 dimensional sensor array, as opposed to a film, as the array will be the vehicle for creating the 2 dimensional pixellation of the image generated by the scintillation material. FIG. 18 shows several cross-sections of channel 154, illustrating several (rectangular, v-shaped, truncated v-shaped, semicircular, etc.) of the many possible cross sections channel 154 may assume. Of course, channels 154 may extend horizontally, vertically, or diagonally across the surface of body 164. In fact, channels 154 may be made to intersect one another to form islands 172 of body material as shown in the embodiment 170 of FIG. 19, and discussed in U.S. Pat. No. 5,418,377, which is incorporated by reference herein.

A completed image capture device may now be fabricated using the integrated body and scintillation material, of the type for example shown in FIG. 6. The structure 30 is essentially mated with a sensor array 44, with alignment between the columns 40 and the pixels (e.g., 48) set as appropriate. Thus, the pitch of columns 40 may either match the pitch of the pixels in array 44, or be smaller than the pitch of the pixels in array 44. In the first case, registration will be required. This may be accomplished as described in U.S. Pat. No. 5,153,438, which is incorporated herein by reference, or similar process. In the later case, no registration is required, which is a desirable condition. Alternatively, the structure 30 may be temporarily mated with an appropriate film which, following exposure is removed dissociated with body 30 and developed.

Equation (1), above, is the expression for the MTF of a non-pixelized scintillation layer. When pixelized, the MTF may be reduced to the ideal case given by:

$$MTF(\rho)=\frac{\sin\pi\rho p}{\pi\rho p} \quad (2)$$

where p is the larger of the pixel pitch of the scintillation layer and the optionally pixelized detector. Equation (2) for a device manufactured in accordance with the present invention is plotted in FIG. 16, along with the MTF from equation (1) for a series of prior art devices with typical device parameters and varying absorption efficiency. It will be appreciated that as the efficiency increases (i.e., the thickness increases) in the prior art devices, the MTF, and hence resolution, decrease. In fact, FIG. 11 does not show results for a prior art scintillation layer above 39% efficiency, as the MTF is unacceptably low. This is likely due to the relatively large thickness of the higher efficiency layers. However, extremely good MTF performance, and hence high resolution, is shown by modelling for a device according to the present invention at 50% conversion efficiency.

Figure 21:
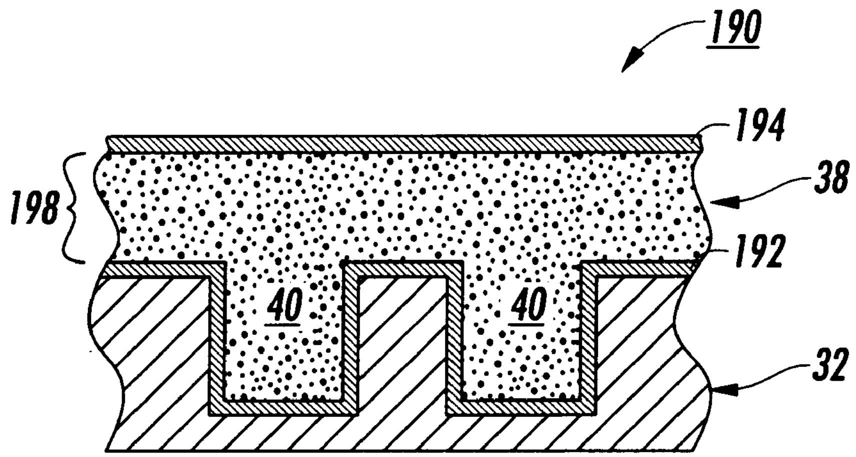
FIG. 21 is a cross section of an image capture device of the type wherein the scintillation material layer may be separated from the body subsequent to its formation.
Figure 22:
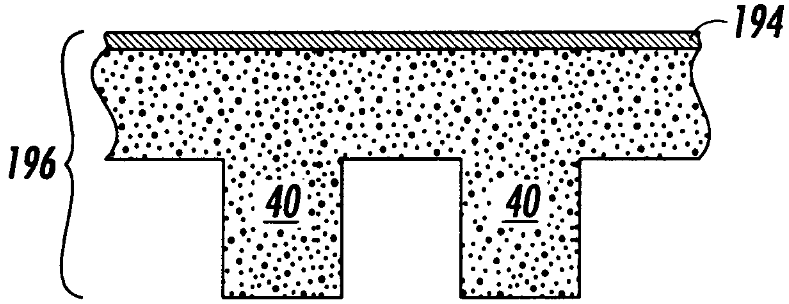
FIG. 22 is a cross section of a scintillation material structure removed from a body, which may be mated with an array or film.

While the invention has been described in terms of a number of specific embodiments, it will be evident to those skilled in the art that many alternatives, modifications, and variations are within the scope of the teachings contained herein. For example, as suggested above, a molded scintillation structure might be constructed by the inclusion of a release or parting layer 192 between the body and the scintillation material, as shown in FIG. 21. If adequate physical integrity can be provided to the scintillation structure, for example by the provision of enough binder material to give the columns 40 (or similar raised structures separated from one another by interstitial regions) and a planar region 198 of the dried binder/scintillation material mechanical rigidity, and/or the inclusion of a carrier 194 such as a glass or plastic plate bonded to the scintillation material, then the release layer may be etched, softened, or otherwise treated to free the molded scintillation material from the body. A stand-alone scintillation structure 196 may thus be obtained, as shown in FIG. 22, which may be joined to a sensor array, film, etc. Accordingly, the present invention should not be limited by the embodiments used to exemplify it, but rather should be considered to be within the spirit and scope of the following claims, and equivalents thereto, including all such alternatives, modifications, and variations.

What is claimed is:

1. A method of making a component for a sensor structure, the method employing a body, comprising the operations of:

etching the body under open areas of an etching mask to form openings in at least a first surface of said body, each opening of said openings having a depth at least three times the distance between opposite walls forming each opening, said openings for receiving scintillation material;

depositing particulate scintillation material at least within said openings by a physical deposition technique, said openings and particulate scintillation material for use in the sensor structure, and bonding an array of sensor elements over said openings in said body.

2. The method of claim 1, wherein said physical deposition technique includes an operation of settling a powdered scintillation material and binder into said openings in said body.

3. The method of claim 1, wherein said physical deposition technique includes an operation of applying a mixture of scintillation material powder, binder, and solvent to said first surface and said openings in said body.

4. The method of claim 1, wherein said openings in said body are defined by walls, and further comprising the operation of depositing a reflective material at least on the walls of said openings in said body.

5. The method of claim 1, wherein the etching of the body to form openings further comprises an operation of forming wells extending part way through the body.

6. The method of claim 1, wherein the etching of the body to form openings further comprises an operation of forming vias extending entirely through said body.

7. The method of claim 1, further comprising an operation of separating the body and scintillation material.

8. The method of claim 7, further comprising an operation of disposing between the body and the scintillation material a parting layer prior to separating the body and scintillation material.

9. The method of claim 7, further comprising an operation of applying a carrier to a surface of the scintillation material opposite the body prior to said operation of separating the body and scintillation material.

10. A method of making a component for a sensor structure, the method employing a body, comprising the operations of:

forming openings in at least a first surface of said body, for receiving scintillation material, by:

depositing a photoresist material over a first surface of said body;

exposing said photoresist material to a mask pattern;

developing said photoresist material so as to form an etching mask having openings therein; and etching said body, at locations under said openings in said etching mask, so as to form openings in said body, each opening having a depth exceeding by at least three times a distance between opposite walls bordering the opening;

depositing scintillation material at least within said openings in said body by a physical deposition technique to form columns containing scintillation material; and positioning the openings to be in optical communication with an array of sensors.

11. The method of claim 10, wherein said physical deposition technique includes an operation of settling a powdered scintillation material and binder into said openings in said body.

12. The method of claim 10, wherein said physical deposition technique includes an operation of applying a mixture of scintillation material powder, binder, and solvent to said first surface and said openings in said body.

13. The method of claim 10, wherein said openings in said body have walls, and further comprising an operation of depositing a reflective material at least on the walls of said openings in said body.

14. The method of claim 10, further comprising an operation of bonding an array of sensor elements over said columns.

15. The method of claim 10, wherein said etching is performed by an ion beam etching process.

16. The method of claim 10, wherein said etching is performed by a chemical etching process.

17. The method of claim 10, wherein said etching further comprises:

anodically etching said body to form at least two adjacent micropores separated by a pore wall; and using a chemical etch to remove said pore wall separating the at least two adjacent micropores to form one opening in said body.

18. The method of claim 17, wherein the chemical etch is an oxide etching process.

19. The method of claim 17, further comprising an operation of isotropically etching said first surface of said body such that surface roughness of said first surface after said operation of isotropically etching is reduced as compared to surface roughness after said operation of anodically etching but prior to said operation of isotropically etching.

20. The method of claim 11, wherein the operation of forming openings in at least a first surface of said body further comprises an operation of forming wells extending part way through said body.

21. The method of claim 10, wherein the operation of forming openings in at least a first surface of said body further comprises an operation of forming vias extending entirely through said body.

22. The method of claim 10, further comprising an operation of separating the body and scintillation material.

23. The method of claim 22, further comprising an operation of disposing between the body and the scintillation material a parting layer prior to said operation of separating the body and scintillation material.

24. The method of claim 22, further comprising an operation of applying a carrier to a surface of the scintillation material opposite the body prior to said operation of separating the body and scintillation material.

25. A method of making a component for a sensor structure, the method employing a body, comprising the operations of:

forming openings in a first surface of said body, for receiving scintillation material, by:

depositing a mask material over a first surface of said body;

depositing a photoresist material over said mask material;

exposing said photoresist material to a mask pattern;

developing said photoresist material so as to form openings in said photoresist material;

etching said mask material through openings in said photoresist material so as to form opening in said mask material;

etching said body, at locations under said openings in said mask material, so as to form micropores having pore walls in said body material;

removing said pore walls by using an oxide etch process to form openings in said body; and depositing scintillation material at least within said openings in said body by a physical deposition technique to form columns containing scintillation material.

26. The method of claim 25, wherein said physical deposition technique includes an operation of settling a powdered scintillation material into said openings in said body.

27. The method of claim 25, wherein said physical deposition technique includes an operation of applying a mixture of scintillation material powder, binder, and solvent to said first surface and said openings in said body.

28. The method of claim 25, wherein said openings in said body have walls, and further comprising an operation of depositing a reflective material at least on the walls of said openings in said body.

29. The method of claim 25, further comprising an operation of bonding an array of sensor elements over said columns.

30. The method of claim 25, wherein the operation of forming openings in a first surface of said body further comprises an operation of forming wells extending part way though said body.

31. The method of claim 25, wherein the operation of forming openings in a first surface of said body further comprises an operation of forming vias extending entirely through said body.

32. The method of claim 25, further comprising an operation of separating the body and scintillation material.

33. The method of claim 32, further comprising an operation of disposing between the body and the scintillation material a parting layer prior to said operation of separating the body and scintillation material.

34. The method of claim 32, further comprising an operation of applying a carrier to a surface of the scintillation material opposite the body prior to said operation of separating the body and scintillation material.

35. The method of claim 25 wherein the micropores have a diameter less 0.1 micrometers.

36. The method of claim 25 wherein after removing said pore walls, the depth of each opening exceeds by at least three times the distance between opposite walls of each opening.

* * * * *